United States Patent [19]
Ree et al.

[11] Patent Number: 5,302,851
[45] Date of Patent: Apr. 12, 1994

[54] CIRCUIT ASSEMBLY WITH POLYIMIDE INSULATOR

[75] Inventors: Moonhor Ree, Hopewell Junction, N.Y.; Willi Volksen, San Jose; Do Y. Yoon, Los Gatos, both of Calif.

[73] Assignee: International Business Machines Corporation, Armonk, N.Y.

[21] Appl. No.: 810,621

[22] Filed: Dec. 19, 1991

[51] Int. Cl.$^5$ .............................................. H01L 39/02
[52] U.S. Cl. .................................. 257/702; 257/643; 257/759
[58] Field of Search .............. 257/792, 632, 643, 701, 257/702, 759; 361/397

[56] References Cited

U.S. PATENT DOCUMENTS

| | | | |
|---|---|---|---|
| 4,489,364 | 12/1984 | Chance et al. | 361/737 |
| 4,508,981 | 4/1985 | Dorler et al. | 307/542 |
| 4,628,411 | 12/1986 | Balderes et al. | 361/794 |
| 4,640,972 | 2/1987 | Irwin | 528/188 |
| 4,811,082 | 3/1989 | Jacobs et al. | 257/700 |
| 4,847,353 | 7/1989 | Watanabe | 528/353 |

Primary Examiner—Sara W. Crane
Attorney, Agent, or Firm—Robert B. Martin

[57] ABSTRACT

The present invention relates to a circuit assembly comprising the polyimide poly(3,4'-oxydiphenylene pyromellitimide).

5 Claims, No Drawings

CIRCUIT ASSEMBLY WITH POLYIMIDE INSULATOR

FIELD OF THE INVENTION

The present invention relates to a circuit assembly comprising the polyimide poly(3,4'-oxydiphenylene pyromellitimide) and in particular to a multichip module comprising poly(3,4'-oxydiphenylene pyromellitimide).

BACKGROUND OF THE INVENTION

Polyimides are known in the art for use in the manufacture of circuit assemblies such as chips (e.g. chip back end of line), multichip modules, and circuit boards. For example, Watanabe's U.S. Pat. No. 4,847,353 discloses the use of a large class of polyimides and copolymers of polyimides in the manufacture of circuit boards. Polyimides are useful in forming dielectric layers, passivation layers, alpha particle barriers and stress buffers. Polyimides are also useful as a dielectric material to insulate the conductor wiring interconnecting integrated circuit chips on a multichip module. A multichip module is an intermediate level of packaging between the chips and the circuit board. Multichip modules are made up of a plurality of insulating and conducting layers wherein the conducting power, signal and ground layers deliver power to the chips and distribute the input/output signals between chips on the module or to/from the circuit board. Multichip modules typically contain input/output pins on the bottom surface for connection to the circuit board.

Poly(4,4'-oxydiphenylene pyromellitimide) is a insulating polyimide polymer used in the manufacture of multichip modules and chips. However, in some cases, such as under high temperature and humidity, films comprising this polyimide will separate (lift off) from the substrate or underlying polymer layer. This separation causes defects or voids which can lead to corrosion and eventual electrical shorts or opens in the wiring. There still is a need in the art for a suitable polyimide having good physical, insulative and adhesion properties for use in making circuit assemblies.

It is therefore an object of the present invention to provide a circuit assembly comprising one or more layers of a polyimide having improved adhesion properties.

SUMMARY OF THE INVENTION

The present invention relates to a circuit assembly comprising poly(3,4'-oxydiphenylene pyromellitimide). In particular, the present invention relates to integrated circuit chips, multichip modules and circuit boards comprising poly(3,4'-oxydiphenylene pyromellitimide). One preferred embodiment of the present invention relates to an integrated circuit packaging structure (a multichip module) for providing signal and power current to a plurality of integrated circuit chips comprising: (i) a substrate having electrical connecting means for connection to a circuit board (ii) a plurality of insulating and conducting layers positioned on said substrate wherein at least one of the layers comprises poly(3,4'-oxydiphenylene pyromellitimide) and (iii) a plurality of vias for electrically interconnecting electrical connecting means, conducting layers and integrated circuit chips.

A more thorough disclosure of the present invention is presented in the detailed description which follows.

DETAILED DESCRIPTION OF THE INVENTION

The present invention relates to circuit assembly comprising poly(3,4'-oxydiphenylene pyromellitimide). A preferred embodiment of the present invention relates to an integrated circuit packaging structure for providing signal and power current to a plurality of integrated circuit chips comprising: (i) a substrate having electrical connecting means for connection to a circuit board (ii) a plurality of alternating electrically insulating and conducting layers positioned on the substrate wherein at least one of the layers comprises poly(3,4'-oxydiphenylene pyromellitimide) and (iii) a plurality of vias for electrically interconnecting electrical connecting means, conducting layers and integrated circuit chips.

The integrated circuit packaging structure of the present invention is an intermediate level of packaging between the integrated circuit chip and the circuit board. The integrated circuit chips are mounted on the integrated circuit packaging structure which is in turn mounted on the circuit board.

The substrate of the packaging structure is generally an inert substrate such as glass, silicon or ceramic. The substrate can optionally have integrated circuits disposed therein. The substrate is provided with electrical connecting means such as input/output pins (I/O pins) for electrically connecting the packaging structure to the circuit board. A plurality of electrically insulating and electrically conducting layers (layers having conductive circuits disposed in an insulating material) are alternately stacked up on the substrate. The layers are generally formed on the substrate in a layer by layer process wherein each layer is formed in a separate process step. At least one of these layers, comprises poly(3,4-oxydiphenylene pyromellitimide). The packaging structure also comprises receiving means for receiving the integrated circuit chips. Suitable receiving means include pinboards for receipt of chip I/O pins or metal pads for solder connection to the chip. Generally, the packaging structure also comprises a plurality of electrical vias generally vertically aligned to electrically interconnect the I/O pins, the conductive layers and integrated circuit chips disposed in the receiving means. The function, structure and method of manufacture of the integrated circuit packaging structure are well known to those skilled in the art as disclosed in U.S. Pat. Nos. 4,489,364; 4,508,981; 4,628,411 and 4,811,082, the disclosures of which are incorporated herein by reference.

Poly(3,4'-oxydiphenylene pyromellitimide) has the property of excellent self adhesion and good adhesion to substrates in combination with good thermal and mechanical properties. The poly(3,4'-oxydiphenylene pyromellitimide diester) precursor has good solution properties to enable the formation of a thin film which can be subsequently thermally imidized. The fully cured polymer exhibits an Instron tensile modulus of about 5 GPa and elongation-at-break of about 120%. The thermal properties are demonstrated by a tensile modulus greater than 1 GPa up to about 450° C. and about 0.04%/hour weight loss at 400° C. under nitrogen. Solvent uptake in N-methylpyrrolidone for 1 hour at 85° C. was about 3% by weight. Preferably, to obtain the best adhesion properties, the poly(3,4'-oxydiphenylene pyromellitimide) should be prepared from poly(3,4'-oxydiphenylene pyromellitate diester) precursor which can be readily prepared using art known synthetic techniques. Preferably, the diester is dialkyl ester, preferably ($C_1$–$C_6$) dialkyl diester.

In an alternative embodiment, the present invention relates to a circuit board having a layer of poly(3,4-oxydiphenylene pyromellitimide) ("POP") disposed thereon. The POP functions to insulate, passivate and environmentally seal the circuit board. The function structure and method of manufacture of circuit boards is also well known to those skilled in the art. In another alternative embodiment, the present invention relates to an integrated circuit chip generally in the back end of the line of the chip, comprising poly(3,4'-oxydiphenylene pyromellitimide). The polyimide can serve a variety of functions including insulating and passivating.

In another alternative embodiment, the present invention relates to integrated circuit module comprising poly(3,4'-oxydiphenylene pyromellitimide). The integrated circuit module of the present invention generally comprises integrated circuit chips mounted on an integrated circuit packaging structure which is in turn mounted on a circuit board. The poly(3,4'-oxydiphenylene pyromellitimide) can be disposed on the circuit board, the chip or as a layer in the packaging structure.

The following examples are detailed descriptions of methods of preparation and use of the polymer of the present invention. The detailed preparations fall within the scope of, and serve to exemplify, the more generally described methods of preparation set forth above. The examples are presented for illustrative purposes only, and are not intended as a restriction on the scope of the invention.

EXAMPLE 1

Synthesis of Poly(3,4'-oxydiphenylene pyromellitamide diethyl ester)

A 500 ml three-neck flask equipped with mechanical stirrer, addition funnel, and gas bubbler was charged with 14.16 gm (0.0708 mole) of freshly sublimed 3,4'-oxydianiline, ca. 220 m of freshly distilled N-methylpyrrolidone (NMP) and 11.10 gm (0.140 mole) of dry pyridine. Once the diamine had dissolved, the mixture was cooled externally with ice (ca.5° C.) and 24.3 gm (0.0700 mole) of diethyl pyromellitate diacyl chloride (obtained via the reaction of diethyl dihydrogen pyromellitate with oxalyl chloride in ethyl acetate) dissolved in 50 ml of dry tetrahydrofuran was added dropwise over a period of 30 minutes. Once the diacyl chloride addition was complete, the temperature was allowed to gradually return to ambient temperature and stirring was continued for another 16 hours. The mixture was then poured into distilled water and precipitated with vigorous stirring by a blender. The light yellow colored material was then filtered and extracted with more distilled water, followed by methanol, and finally ethyl acetate to facilitate drying. The polymer was then dried under vacuum at 50° C. for 24 hours. The polymer had $M_w$=45,000 and was soluble and processible in NMP at ca. 30% by weight.

EXAMPLE 2

SELF ADHESION TEST

The polymer to be tested was mixed with NMP (ca. 18.8% by weight) to form a solution which was either spin coated or doctor-bladed on a like polymer substrate layer that had been cured at 400° C. The film was dried on a hot plate at 80° C. for 1 hour under nitrogen flow. Subsequently, the film was put in an oven under nitrogen atmosphere and cured as follows: 150° C. for 30 min., 200° C. for 30 min., 300° C. for 30 min., and then finally 400° C. for 1 hour.

Each fully cured polymer was L-tested (90° peel test) by Instron tensile tester. Then each polymer was thermally and humidity stressed (T & H stress) for 200 hours at 85° C. and 85% humidity and retested. The results were as follows:

1. Poly(3,4'-oxydiphenylene pyromellitimide)

| Before T & H Stress | |
| --- | --- |
| Sample 1+ | 106 g/mm at 0.5 mm/min peel rate |
| | 110 g/mm at 1.5 mm/min peel rate |
| After T & H Stress | |
| Sample 1 | 89 g/mm at 0.5 mm/min peel rate |

+Example 1 polymer

2. Poly(4,4'-oxydiphenylene pyromellitimide)

| Before T & H Tests | |
| --- | --- |
| *Sample 1 | 4–5 g/mm at 1.5 mm/min peel rate |
| **Sample 2 | 1–3 g/mm at 1.5 mm/min peel rate |
| ***Sample 3 | 4–5 g/mm at 1.5 mm/min peel rate |
| After T & H Tests | |
| Sample 1 | 1–3 g/mm at 1.5 mm/min peel rate |
| Sample 2 | failed |
| Sample 3 | 1–3 g/mm at 1.5 mm/min peel rate |

*prepared from poly (4,4'-oxydiphenylene metapyromellitamide diethylester)
**poly(4,4'-oxydiphenylene pyromellitamic acid)
***poly(4,4'-oxydiphenylene pyromellitamide diethylester)

EXAMPLE 3

SUBSTRATE ADHESION TEST

The polymer to be tested was coated on top of a polished and oxygen plasma ashed glass ceramic substrate with and without the adhesion promotor gamma-amino propyl triethoxy silane sold by Ohio Valley Specialty Chemical Co. under Trade name A1100. The polymers were then fully cured and L-tested. The results were as follows:

Poly(3,4-oxydiphenylene pyromellitimide)

| Before T & H Testing | |
| --- | --- |
| Without A1100 | 89–94 g/mm at 0.5 mm/min peel rate |
| With A1100 | 89–92 g/mm at 0.5 mm/min peel rate |
| After T & H Testing | |
| With A1100 | 73 g/mm at 0.5 mm/min |
| Without A1100 | fail |

Poly (4,4'-oxydiphenylene pyromellitimide)*

| Before T & H Testing | |
| --- | --- |
| Without A1100 | 70 g/mm at 1.5 mm/min peel rate |
| With A1100 | 70–90 g/mm at 1.5 mm/min peel rate |
| After T & H Testing | |
| With A1100 | 55–78 gm/mm at 1.5 mm/min peel rate |
| Without A1100 | fail |

EXAMPLE 4

SUBSTRATE ADHESION TEST

The polymer to be tested was coated on an oxygen plasma ashed silicon wafer substrate with and without the adhesion promotor A1100. The polymers were then fully cured and L-tested. The results were as follows:

| Poly(3,4-oxydiphenylene pyromellitimide) | |
|---|---|
| Without A1100 | 63 g/mm at 0.5 mm/min peel rate |
| With A1100 | 105 g/mm at 0.5 mm/min peel rate |

| Poly(4,4'-oxydiphenylene pyromellitimide)* | |
|---|---|
| Without A1100 | <5 g/mm at 0.5 mm/min peel rate |
| With A1100 | 94 g/mm at 0.5 mm/min peel rate |

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. An integrated circuit packaging structure for providing signal and power current to a plurality of integrated circuit chips comprising:
    a substrate having electrical connecting means for connection to a circuit board;
    a plurality of insulating and conducting layers stacked on said substrate wherein at least one of the layers comprises poly(3,4'-oxydiphenylene pyromellitimide); and
    a plurality of vias for electrically interconnecting the electrical connecting means, the conducting layers and the integrated circuit chips.

2. An integrated circuit packaging structure for providing signal and power current to a plurality of integrated circuit chips comprising:
    a substrate having electrical connecting means for connection to a circuit board;
    a plurality of insulating and conducting layers stacked on said substrate wherein at least one of the layers comprises poly(3,4'-oxydiphenylene pyromellitimide); a receiving means for receiving integrated circuit chips, and
    a plurality of vias for electrically interconnecting the electrical connecting means, the conducting layers and the receiving means.

3. The packaging structure of claim 2 wherein said electrical connecting means is input/output pins.

4. The packaging structure of claim 3 wherein said receiving means is metal pads.

5. The packaging structure of claim 2 wherein said structure further includes integrated circuit chips.

* * * * *